United States Patent
Yanagigawa

(12) 
(10) Patent No.: US 6,384,453 B1
(45) Date of Patent: May 7, 2002

(54) HIGH WITHSTAND VOLTAGE DIODE AND METHOD FOR MANUFACTURING SAME

(75) Inventor: Hiroshi Yanagigawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/411,364

(22) Filed: Oct. 4, 1999

(30) Foreign Application Priority Data

Oct. 9, 1998 (JP) .......................................... 10-288061

(51) Int. Cl.⁷ ............................................... H01L 23/62
(52) U.S. Cl. ...................... 257/355; 257/551; 257/577; 257/546; 257/547
(58) Field of Search ................................ 257/355, 577, 257/546, 547, 551

(56) References Cited

U.S. PATENT DOCUMENTS 5,912,495 A * 6/1999 Dupetro et al. ............. 257/539
5,994,760 A * 11/1999 Duclose ..................... 257/546

FOREIGN PATENT DOCUMENTS

| JP | 8-130318 | 5/1996 |
| JP | 9-97844 | 4/1997 |

* cited by examiner

*Primary Examiner*—Fetsum Abraham
(74) *Attorney, Agent, or Firm*—Sughrue Mion, PLLC

(57) ABSTRACT

A high withstand voltage diode for protecting a high-voltage transistor has a first region 2 of a second conductivity type formed on the substrate of a first conductivity type, a high-concentration second region 5 of the second type formed on the first region 2, a third region 3 of the first conductivity type formed so as to, be adjacent to the first region 2, a high-concentration fourth region 4 of the first conductivity type formed on the surface of the third region 3, and a gate electrode 7 that straddles the first region 2 and the third region 3 with an intervening gate oxide film, and which is electrically connected to the fourth region.

4 Claims, 4 Drawing Sheets

HIGH WITHSTAND VOLTAGE DIODE AND METHOD FOR MANUFACTURING SAME

BACKGROUND OF THE INVENTION

1. Field of the Invention

The present invention relates to a high withstand voltage diode and a method for manufacturing such a high withstand voltage diode, and more particularly to a high withstand voltage diode suitable for use in protection of a high-voltage transistor, such as diode having a withstand voltage of 60 to 300 V which is used in the protection of a driver IC for a plasma display panel, or a protective diode having a withstand voltage of 200 to 1000 V in the protection of a power supply IC, and to a method for manufacturing such a diode.

2. Background of the Invention

Prior art related to the present invention will be described with regard to the example of a 150-V diode that is fabricated on a p-type semiconductor substrate, such as shown in FIG. 4(a).

This high withstand voltage diode is fabricated by forming an n-type diffusion layer 32 having a surface concentration of $1 \times 10^{16}$ atoms/cm$^3$ and a depth of approximately 15 μm as a cathode on a $1 \times 10^{14}$ atoms/cm$^3$ substrate, and forming a p-type diffusion layer 34 onto that surface as an anode, and forming a n-type high-concentration diffusion layer 35 that serves as the cathode, which is approximately 15 μm distant from the anode. To alleviate the electrical field in the area surrounding the high-concentration p-type diffusion layer 34 of the anode, a low-concentration p-type diffusion layer 33 is formed.

The reference numeral 38 denotes a cathode electrode that is formed on the high-concentration n-type diffusion layer 35, 39 is an anode electrode that is formed on the high-concentration p-type diffusion layer 34, and 36 is a field insulation layer.

When the above-noted high withstand voltage diode is used for protecting a high-voltage transistor, however, because it is necessary to set the withstand voltage of the diode to a voltage that is lower than the withstand voltage of the transistor, it is necessary to adjust the concentration on the n-type diffusion layer 32, which establishes the withstand voltage. For this reason, when the above-noted high withstand voltage diode is formed on the same chip for the purpose of protecting a high-voltage transistor on that chip, there is the problem that it is necessary to form separately an n-type diffusion layer 32 for a high withstand voltage diode and an n-type diffusion layer for a transistor, these diffusion layers having different concentrations, which results in an increase in the number of manufacturing steps, and an increase in cost.

FIG. 4(b) shows the example of shorting a gate electrode 47 and a source electrode 49 of a high-voltage transistor and using the high-voltage transistor as a protective diode.

In this drawing, the reference numeral 42 denotes an n-type diffusion layer that is formed on a p-type substrate 41, 43 is a low-concentration p-type diffusion layer that is formed so as to be adjacent to the n-type diffusion layer 42, 44 is a high-concentration p-type diffusion layer that is formed on the surface of the low-concentration p-type diffusion layer 43, 50 is a high-concentration n-type diffusion layer that is formed on the surface of the low-concentration p-type diffusion layer 43, 45 is a high-concentration n-type diffusion layer that is formed on the surface of the n-type diffusion layer 42, 47 is a gate electrode, which is formed via a gate oxide film so as to straddle the low-concentration p-type diffusion layer 43 and the n-type diffusion layer 42, the gate electrode 47 is electrically connected to the high-concentration n-type diffusion layer 50, 48 is a drain electrode that is formed on the high-concentration n-type diffusion layer 45, 49 is a source electrode that is formed on the high-concentration p-type diffusion layer 44 and the high-concentration n-type diffusion layer 50, and 46 is a field oxide film.

In the case of the structure shown in FIG. 4(b), however, because the withstand voltages of the protected transistor and the diode are the same, rather than allowing surge currents and the like to escape via the diode, such surge currents and the like are caused to flow in parallel through the protected transistor and the protective diode, so that the surge current flowing through the transistor is reduced, thereby improving the immunity with respect to damage from surges.

For this reason, a larger protective diode is required, this resulting in an increase in the cost of the chip. With the diode shown in FIG. 4(b), a parasitic NPN transistor is formed by the n-type diffusion layer 42, the p-type diffusion layer 43, and the n-type diffusion layer 50 that are formed between the anode and the cathode.

For this reason, when the parasitic NPN transistor is turned on, because of the current concentration and breakdown resulting, the current immunity of this diode after a breakdown was worse than that of a P-N junction alone.

Accordingly, it is an object of the present invention to improve on the above-noted drawbacks of the prior art, by providing a high withstand voltage diode, in which, without an increase in the number of manufacturing process steps, a high withstand voltage diode is formed that has a lower withstand voltage that the high-voltage transistor to be protected, thereby reliably protecting the high-voltage transistor. It is a further object of the present invention to provide a method for manufacturing the above-noted high withstand voltage diode.

SUMMARY OF THE INVENTION

To achieve the above-noted object, the present invention has the following basic technical constitution.

Specifically, the first aspect of a high withstand voltage diode according to the present invention is a high withstand voltage diode formed on a semiconductor substrate of a first conductivity type comprising, a first region of a second conductivity type formed on the semiconductor substrate, a high-concentration second region of the second conductivity type formed on a surface of the first region, a cathode electrode that is formed on the second region, a third region of the first conductivity type formed so as to be adjacent to the first region, a high-concentration fourth region of the first conductivity type that is formed on a surface of the third region, an anode electrode that is formed on the fourth region, and a gate electrode that is provided on a surface of the semiconductor substrate via an intervening gate oxide film so as to straddle the first region and the third region, the gate electrode is electrically connected to the fourth region.

The second aspect of a high withstand voltage diode according to the present invention is a high withstand voltage diode that protects a high withstand voltage transistor formed on a semiconductor substrate of a first conductivity type having a first region of a second conductivity type formed on the semiconductor substrate, a high-concentration second region of the second conductivity type formed on a surface of the first region, a drain electrode formed on the second region, a third region of the first conductivity type formed so as to be adjacent to the first region, a high-concentration fourth region of the first conductivity type formed on a surface of the third region, a high-concentration fifth region of the second conductivity type formed on a surface of the third region, a source electrode that is formed at least on the fifth region; and a gate electrode that is provided via an intervening gate oxide film so as to straddle the first region and the third region, the gate electrode being electrically connected to the fifth region, wherein the diode and the transistor are formed on a same semiconductor substrate, and the diode comprising, a first region of the second conductivity type of this diode that is formed simultaneously with the first region of the high-voltage transistor formed on the semiconductor substrate, a high-concentration second region of the second conductivity type that is formed within the first region of the diode, the high-concentration second region of the diode being formed simultaneously with said high-concentration second region of the high withstand voltage transistor, a third region of the first conductivity type that is formed simultaneously with the third region of the high withstand voltage transistor, the third region of the diode being formed so as to be adjacent to said first region of said diode, a cathode electrode formed on the second region of the diode, a high-concentration fourth region of the first conductivity type that is formed within the third region of the diode, the high-concentration fourth region of the diode being formed simultaneously with the high-concentration fourth region of the high withstand voltage transistor, and an anode electrode formed on the fourth region of said diode, a gate electrode that is provided on a surface of the semiconductor substrate via an intervening gate oxide film so as to straddle the first region and the third region of the diode, the gate electrode being electrically connected to the fourth region of said diode.

In the third aspect of a high withstand voltage diode according to the present invention, a distance from an edge of the first region to an edge of the second region of the diode is smaller than that of the transistor.

In the fourth aspect of a high withstand voltage diode according to the present invention, the high withstand voltage diode is formed on an SOI substrate.

The first aspect of a method according to the present invention is a method of manufacturing a high withstand voltage diode formed on a semiconductor substrate of a first conductivity type having a first region of a second conductivity type formed on the semiconductor substrate, a high-concentration second region of the second conductivity type formed on a surface of the first region, a cathode electrode that is formed on the second region, a third region of the first conductivity type formed so as to be adjacent to the first region, a high-concentration fourth region of the first conductivity type that is formed on a surface of the third region, an anode electrode that is formed on the fourth region, and a gate electrode that is provided on a surface of the semiconductor substrate via an intervening gate oxide film so as to straddle the first region and the third region, the gate electrode being electrically connected to said fourth region, wherein a distance from an edge of the first region to an edge of the second region of the diode is made a prescribed length, so as to adjust the withstand voltage.

The second aspect of a method according to the present invention is a method for manufacturing a high withstand voltage diode that protects a high withstand voltage transistor formed on a semiconductor substrate of a first conductivity type having a first region of a second conductivity type formed on the semiconductor substrate, a high-concentration second region of the second conductivity type formed on a surface of the first region, a drain electrode formed on the second region, a third region of the first conductivity type formed so as to be adjacent to the first region, a high-concentration fourth region of the first conductivity type formed on a surface of the third region, a high-concentration fifth region of the second conductivity type formed on a surface of the third region, a source electrode formed at least on the fifth region; and a gate electrode that is provided on a surface of the substrate via an intervening gate oxide film so as to straddle the first region and the third region, the gate electrode being electrically connected to the fifth region, wherein the diode having a first region of a second conductivity type formed on the semiconductor substrate of a first conductivity type, a high-concentration second region of the second conductivity type formed on a surface of the first region, a cathode electrode that is formed on the second region, a third region of the first conductivity type formed so as to be adjacent to the first region, a high-concentration fourth region of the first conductivity type that is formed on a surface of the third region, an anode electrode that is formed on the fourth region, and a gate electrode that is provided on a surface of the semiconductor substrate via an intervening gate oxide film so as to straddle the first region and the third region, the gate electrode being electrically connected to the fourth region, wherein the diode and transistor are formed on a same semiconductor substrate, and the first region of the transistor and the first region of the diode, the third region of the transistor and the third region of the diode, and the second region of the transistor and the second region of said diode are respectively formed simultaneously.

In the third aspect of a method of manufacturing a high withstand voltage diode according to the present invention, the high withstand voltage diode is formed on an SOI substrate.

In a high withstand voltage diode configured as described above, it is possible to adjust the withstand voltage by making the length from an edge of the second region to an edge of the third region a prescribed length, thereby making it possible to manufacture a high withstand voltage diode having a withstand voltage that is smaller than the withstand voltage of the transistor that is being protected.

DESCRIPTION OF THE PREFERRED EMBODIMENTS

Preferred embodiments of the present invention are described in detail below, with references being made to relevant accompanying drawings.

Figure 1A:
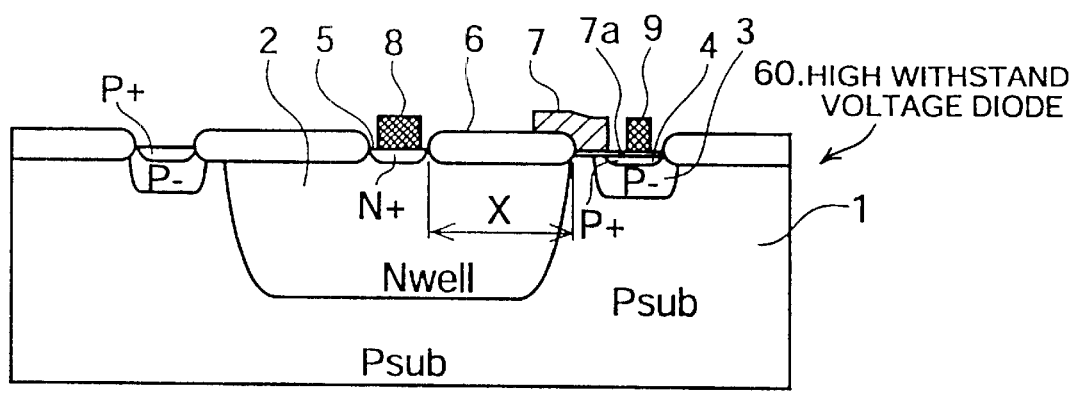
FIG. 1(*a*) is a cross-section view that shows an embodiment of a high withstand voltage diode according to the present invention, and FIG. 1(*b*) is a cross-section view that shows a high-voltage transistor that is protected by a high withstand voltage diode.

FIG. 1(a) is a cross-section view that shows the structure of an embodiment of a high withstand voltage diode according to the present invention. This drawing shows a high withstand voltage diode that has a first region 2 of a second conductivity type formed on the semiconductor substrate 1 of a first conductivity type, a high-concentration second region 5 of the second conductivity type formed on the surface of the first region 2, a cathode electrode 8 formed on the second region 5, a third region 3 of the first conductivity type formed so as to be adjacent to the first region 2, a high-concentration fourth region 4 of the first conductivity type formed on the surface of the third region 3, an anode electrode 9 formed on the fourth region 4, and a gate electrode 7 provided on the semiconductor substrate via an intervening gate oxide film 7a so as to straddle the first region 2 and the third region 3, this gate being electrically connected to the fourth region 4.

The according to the present invention is described in further detail below.

Figure 1B:
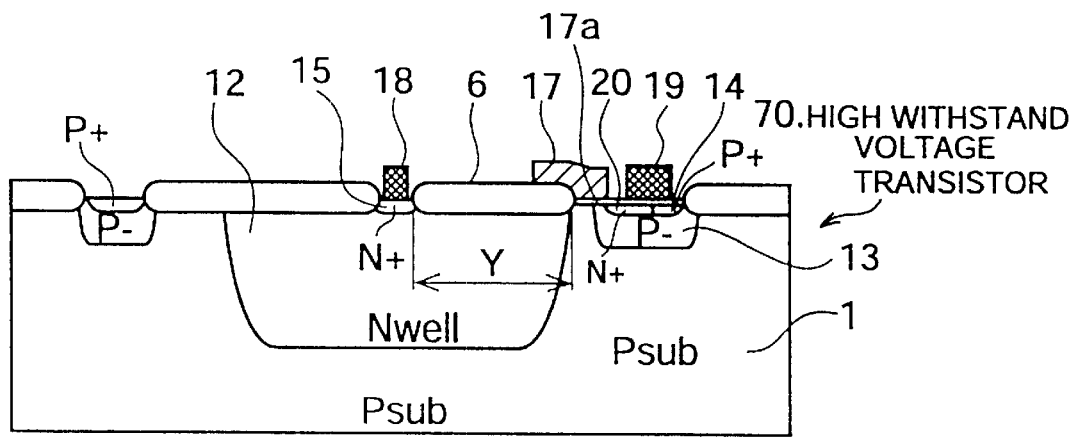

FIG. 1(a) shows the cross-section view of a high withstand voltage diode 60 according to the present invention, and FIG. 1(b) shows the cross-section view of a high working voltage transistor 70 that is protected thereby, this high withstand voltage diode 60 and high-voltage transistor 70 being formed simultaneously on the same substrate.

As shown in FIG. 1(a), the high withstand voltage diode according to the present invention is formed by a p-type substrate 1, an n-type diffusion layer 2 formed on the p-type substrate 1, a high-concentration n-type diffusion layer 5 formed on the n-type diffusion layer 2, a cathode electrode 8 formed on the n-type diffusion layer 5, a low-concentration p-type diffusion layer 3 formed so as to be adjacent to the n-type diffusion layer 2, a high-concentration p-type diffusion layer 4 formed on the surface of the p-type diffusion layer 3, and a gate polysilicon (gate electrode) 7, this gate polysilicon 7 being provided so as to straddle the p-type diffusion layer 3 and the n-type diffusion layer 2, and being electrically connected to the fourth region 4.

The high-voltage transistor that is protected, as shown in FIG. 1(b), has an n-type diffusion layer 12 that is formed simultaneously with the n-type diffusion layer 2 of the high withstand voltage diode on the p-type substrate 1, a low-concentration p-type diffusion layer 13 that is formed simultaneously with the p-type diffusion layer 3 of the high withstand voltage diode so as to be adjacent to the n-type diffusion layer 12, a high-concentration p-type diffusion layer 14 that is formed on the surface of the low-concentration p-type diffusion layer 13 that is formed simultaneously with the p-type diffusion layer 4 of the high withstand voltage diode, a high-concentration n-type diffusion layer 15 that is formed on the surface of the n-type diffusion layer 12 that is formed simultaneously with the n-type diffusion layer 5 of the high withstand voltage diode, a high-concentration n-type diffusion layer 20 that is formed on the surface of the low-concentration p-type diffusion layer 13, the layer 20 being formed simultaneously with the high-concentration n-type diffusion layer 15, a gate electrode 17 that is formed simultaneously with the gaze electrode 7 of the high withstand voltage diode on a gate oxide film 17a so as to straddle the low-concentration p-type diffusion layer 13 and the n-type diffusion layer 12, and the gate electrode 17 is electrically connected to the high-concentration n-type diffusion layer 20, a drain electrode 18 formed on the high-concentration n-type diffusion layer 15 the drain electrode being formed simultaneously with the cathode electrode 8 of the high withstand voltage diode, a source electrode 19 formed on the high-concentration p-type diffusion layer 14 and on the high-concentration n-type diffusion layer 20, the source electrode 9 being formed simultaneously with the anode electrode 9 of the high withstand voltage diode, and a field oxide film 6.

In a high withstand voltage diode having the above-noted structure, when a high voltage is applied to the high-concentration n-type diffusion layer 5 that serves as the cathode, if the n-type diffusion layer 2, which acts as an electrical field relieved layer so as to extend a depletion layer sufficient to achieve the prescribed withstand voltage, the withstand voltage of this high withstand voltage diode is established by the distance X from the edge of the n-type diffusion layer 2 to the edge of the high-concentration n-type diffusion layer 5.

In the same manner, in the high-voltage transistor of FIG. 1(b), the withstand voltage is established by the distance Y from the edge of the n-type diffusion layer 12 to the edge of the high-concentration n-type diffusion layer 15. Therefore, if the distance X is made smaller than the distance Y from the edge of the n-type diffusion layer 12 that serves as an electrical field relieved layer of the protected transistor to the edge of the high-concentration n-type diffusion layer 15, it is possible to reliably establish the withstand voltage of the diode of the present invention as smaller than the withstand voltage of the high-voltage transistor.

It is, therefore, possible to make the withstand voltage of the diode smaller than that of the high-voltage transistor, without changing the concentrations of the diffusion layers 2 and 12. Additionally, because there is no n-type diffusion layer on the anode, a parasitic npn transistor is not formed. For this reason, because there is no concentration of current after breakdown, the withstand current is also large.

Figure 2A:
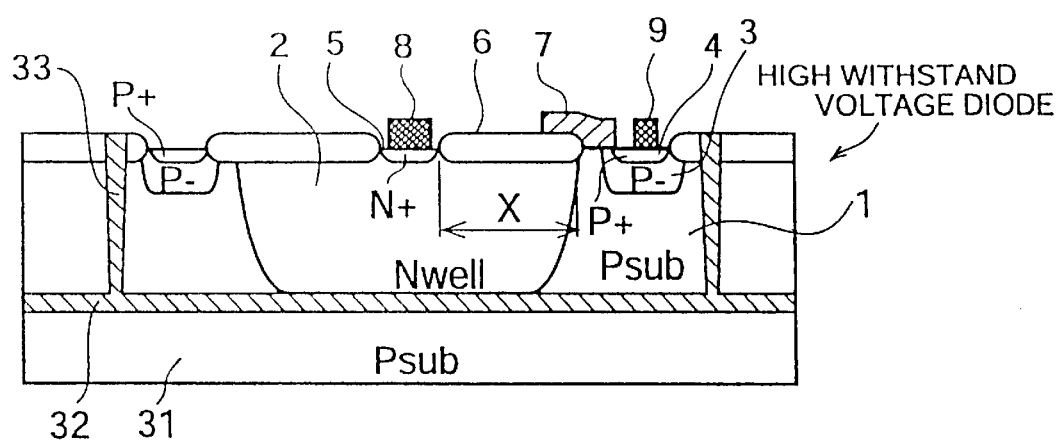
FIG. 2(*a*) is a cross-section view that shows another embodiment of a high withstand voltage diode according to the present invention and FIG. 2(*b*) is a cross-section view that shows a high-voltage transistor that is protected by a high withstand voltage diode.
Figure 2B:
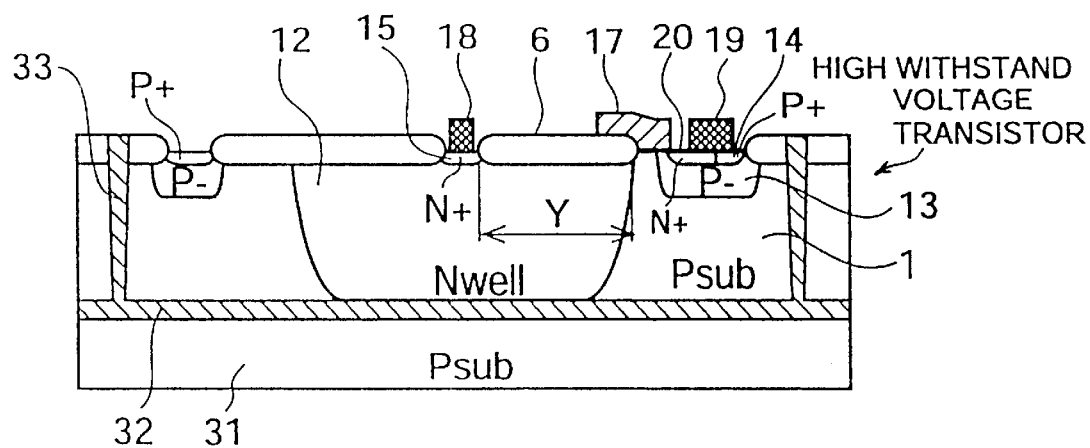
Figure 3:
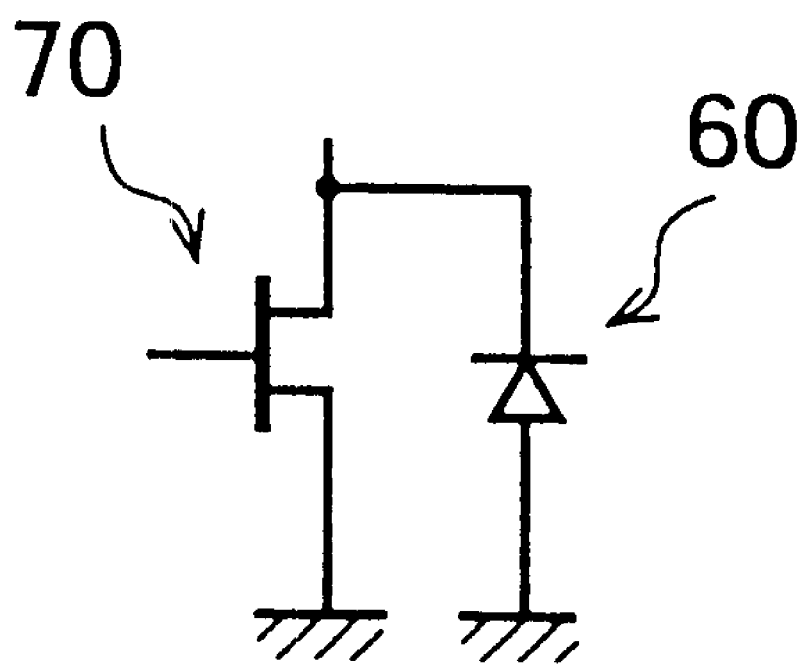
FIG. 3 is an equivalent protection circuit diagram using a high withstand voltage diode according to the present invention.
Figure 4:
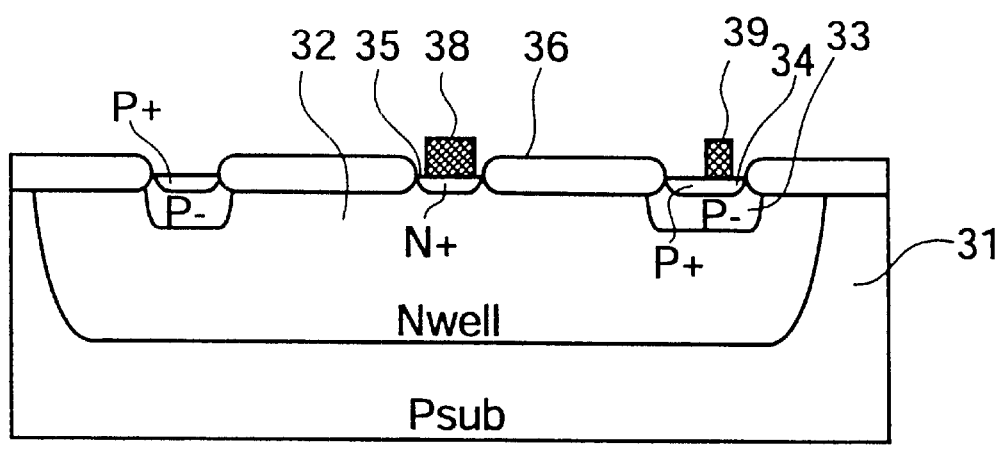
FIG. 4(*a*) is a cross-section view of a high withstand voltage diode of the prior art, and FIG. 4(*b*) is a cross-section view of another high withstand voltage diode of the prior art.
Figure 4:
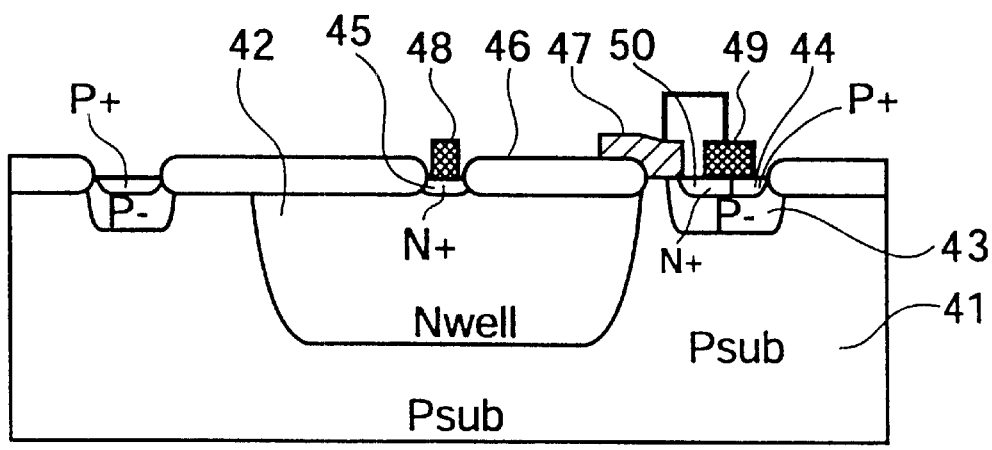

FIGS. 2(a) and 2(b) show a high withstand voltage diode and high-voltage transistor that are formed on an 301 (silicon on insulator) substrate.

Elements in FIGS. 2(a) and 2(b) that are the same as in FIGS. 1(a) and 1(b) are assigned the same reference numerals, and will not be explicitly described herein.

FIGS. 2(a) and 2(b), the reference numeral 31 is an SOI substrate, 32 is an abutted oxide film of the SOI substrate 31, and 33 is a trench separation oxide film that separates each element.

As in the case of the high withstand voltage diode 25 of FIG. 1(a), it is necessary to use the anode electrode at ground level, in the above-noted configuration, because the substrate and the elements are electrically isolated, and it is possible to freely establish the potential of the electrodes of the high withstand voltage diode.

Additionally, because of the improved controllability of the depletion layers formed within the n-type diffusion layers 2,12 that serve as electrical field relieved layer it is possible to achieve a high withstand voltage diode and high-voltage transistor with little variations.

It should be understood that the high withstand voltage diode of the present invention can also be configured for protection of a high withstand voltage IGBT.

By adopting the above-noted configuration, a high withstand voltage diode and method for manufacturing a high withstand voltage diode according to the present invention make it possible to form a high withstand voltage diode having a withstand voltage that is lower than that of the high-voltage transistor being protected, at a low cost and with no added process steps, and to also provide reliable protection for the high-voltage transistor.

What is claimed is:

1. A high withstand voltage diode formed on a semiconductor substrate of a first conductivity type, comprising:
   a first region of a second conductivity type formed on said semiconductor substrate;
   a high-concentration second region of said second conductivity type formed on a surface of said first region;
   a cathode electrode formed on said second region;
   a third region of said first conductivity type formed so as to be adjacent to said first region;
   a high-concentration fourth region of said first conductivity type that is formed on a surface of said third region;
   an anode electrode that is formed on said fourth region; and
   a gate electrode that is provided on a surface of said semiconductor substrate via an intervening gate oxide film so as to straddle said first region and said third region, said gate electrode being electrically connected to said fourth region.

2. A high withstand voltage diode that protects a high withstand voltage transistor formed on a semiconductor substrate of a first conductivity type, said high withstand voltage transistor comprising a first region of a second conductivity type formed on said semiconductor substrate, a high-concentration second region of said second conductivity type formed on a surface of said first region, a drain electrode formed on said second region, a third region of said first conductivity type formed so as to be adjacent to said first region, a high-concentration fourth region of said first conductivity type formed on a surface of said third region, a high-concentration fifth region of said second conductivity type formed on a surface of said third region, a source electrode that is formed at least on said fifth region, and a gate electrode that is provided via an intervening gate oxide film so as to straddle said first region and said third region, said gate electrode being electrically connected to said fifth region, wherein said diode and said transistor are each formed on said semiconductor substrate, said diode comprising:
   a first region of said second conductivity type of said diode that is formed simultaneously with said first region of said high-voltage transistor formed on said semiconductor substrate;
   a high-concentration second region of said second conductivity type that is formed within said first region of said diode, said high-concentration second region of said diode being formed simultaneously with said high-concentration second region of said high withstand voltage transistor;
   a third region of said first conductivity type that is formed simultaneously with said third region of said high withstand voltage transistor, said third region of said diode being formed so as to be adjacent to said first region of said diode;
   a cathode electrode formed on said second region of said diode;
   a high-concentration fourth region of said first conductivity type that is formed within said third region of said diode, said high-concentration fourth region of said diode being formed simultaneously with said high-concentration fourth region of said high withstand voltage transistor;
   an anode electrode formed on said fourth region of said diode; and
   a gate electrode provided on a surface of said semiconductor substrate via an intervening gate oxide film so as to straddle said first region and said third region of said diode, said gate electrode being electrically connected to said fourth region of said diode.

3. A high withstand voltage diode according to claim 2, wherein a distance from an edge of said first region of said diode to an edge of said second region of said diode is smaller than a distance from an edge of said first region of said transistor to an edge of said second region of said transistor.

4. A high withstand voltage diode according to claim 2, wherein the high withstand voltage diode is formed on an SOI substrate.

* * * * *